(12) United States Patent
Isobayashi

(10) Patent No.: US 8,779,590 B2
(45) Date of Patent: Jul. 15, 2014

(54) SEMICONDUCTOR DEVICE AND METHOD OF PRODUCING THE SAME

(75) Inventor: Atsunobu Isobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 13/362,174

(22) Filed: Jan. 31, 2012

(65) Prior Publication Data

US 2012/0319279 A1    Dec. 20, 2012

(30) Foreign Application Priority Data

Jun. 16, 2011  (JP) .................................. 2011-134043

(51) Int. Cl.
*H01L 23/48*   (2006.01)
*H01L 21/768*  (2006.01)

(52) U.S. Cl.
CPC ................................ *H01L 21/76843* (2013.01)
USPC ........................................................ 257/751

(58) Field of Classification Search
USPC ............ 257/751, E23.012, E21.158; 438/653
See application file for complete search history.

(56) References Cited

U.S. PATENT DOCUMENTS

| 7,002,252 | B2 * | 2/2006 | Yamamoto | 257/758 |
| 7,635,646 | B2 * | 12/2009 | Omoto et al. | 438/654 |
| 7,741,228 | B2 * | 6/2010 | Ueki et al. | 438/736 |
| 2009/0075470 | A1 * | 3/2009 | Nitta et al. | 438/618 |
| 2012/0299188 | A1 * | 11/2012 | Chen et al. | 257/773 |

FOREIGN PATENT DOCUMENTS

| JP | 2009-135172 | 6/2009 |
| JP | 2010-141024 | 6/2010 |
| JP | 2010-165864 | 7/2010 |

* cited by examiner

*Primary Examiner* — Fernando L Toledo
*Assistant Examiner* — Neil Prasad
(74) *Attorney, Agent, or Firm* — Oblon, Spivak, McClelland, Maier & Neustadt, L.L.P.

(57) ABSTRACT

According to one embodiment, a semiconductor device includes a semiconductor substrate, wiring lines formed above the semiconductor substrate, and an air gap formed between the adjacent wiring lines. In the semiconductor device, top surfaces and side walls of the wiring lines are covered with the diffusion prevention film, and the air gap is in contact with the interconnects via a diffusion prevention film.

10 Claims, 10 Drawing Sheets

SEMICONDUCTOR DEVICE AND METHOD OF PRODUCING THE SAME

CROSS-REFERENCE TO RELATED APPLICATION

This application is based upon and claims the benefit of priority from prior to Japanese Patent Application No. 2011-134043, filed on Jun. 16, 2011, the entire contents of which are incorporated by reference.

FIELD

The embodiments of the present invention relate to a semiconductor device and a method of producing the same.

BACKGROUND

In a miniaturized multi-layer interconnect (wiring line) used in a semiconductor device at the topmost front of development, a technique of forming an air gap between the wiring lines is proposed as a measure for reducing the RC time constant with respect to the wiring lines, namely, as a measure for reducing the capacitance between the wiring lines.

BRIEF DESCRIPTION OF THE DRAWINGS

FIGS. 1A to 1I are cross-sectional views for describing steps for producing a semiconductor device according to the first embodiment;

DETAILED DESCRIPTION

Figure 1A:
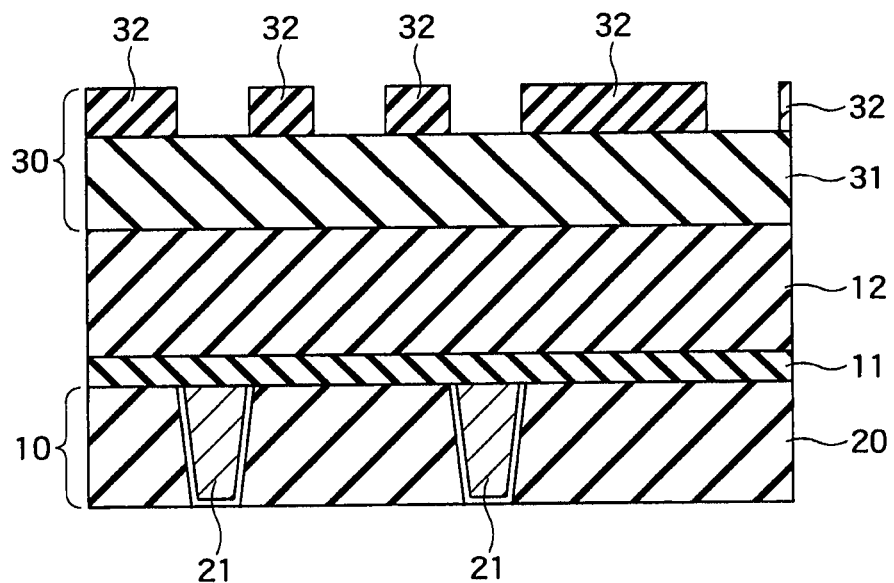

In one embodiment, a semiconductor device includes a semiconductor substrate; wiring lines formed above the semiconductor substrate, top surfaces and side walls of the wiring lines being covered with a diffusion prevention film; and an air gap that is formed between the adjacent wiring lines, the air gap being in contact with the wiring lines via the diffusion prevention film.

Hereafter, the embodiment will be described with reference to the attached drawings. However, the present invention is by no means limited to this embodiment. Here, parts common all through the drawings will be denoted with common reference symbols, and a duplicated description thereof will be omitted. Also, the drawings are model views for promoting description of the invention and understanding thereof, so that the shape, size, ratio, and the like thereof may be different from those of real apparatus; however, these can be suitably changed in design by considering the following description and known arts.

As a method for forming the air gap (void gap), mainly two methods can be mentioned. One is a method of using an oxide film having a comparatively low electric permittivity as a sacrificial film, forming a wiring line by embedding a metal film into a groove formed in the oxide film, and further etching the oxide film by a lithography process, thereby to form an air gap between the wiring lines. The other one is a method of forming an air gap between the wiring lines by using, as a sacrificial film, a material that is vaporized by heat, ultraviolet rays, or electron beams.

By any of these methods, a structure having an air gap in contact with both sides of the metal wiring lines is formed. In such a structure, since there is not a film that restrains the thermal expansion of the metal wiring line, there is a fear that a defect such as electromigration or stress migration is liable to occur.

Further, by the method of forming an air gap using an oxide film as a sacrificial film, there is a fear that moisture may be absorbed into the wiring line from the oxide film adjacent to the wiring line, and the wiring line may be deteriorated. Therefore, in order to prevent such deterioration of the wiring line, there is a need to cover the wiring line with a thick metal film. Also, by the method of using this oxide film, a damage is generated in the oxide film in forming the wiring line, and a portion of the oxide film that has been damaged is selectively etched to form the air gap. Therefore, it is difficult to obtain a desired capacitance between the wiring lines by controlling the size of the air gap. Further, by this forming method, the wiring line is formed by embedding a metal film into a groove formed in the oxide film and performing CMP (Chemical Mechanical Planarization), that is, by the damascene process. However, the oxide film needs to have a scrape margin in performing CMP. In other words, the oxide film needs to be formed to be thicker than a desired thickness by the thickness of the scrape margin. Therefore, the groove of the oxide film formed to be thick has a high aspect ratio, and it is difficult to embed a metal film into the groove having such a high aspect ratio.

Also, by the method of using a material that will be vaporized as a sacrificial film, which is the other method of forming an air gap, the material that will be vaporized is expensive, thereby raising the costs for producing the semiconductor device.

(First Embodiment)

A method of producing a semiconductor device according to the present embodiment will be shown in FIGS. 1A to 1I. Here, a case in which an air gap is formed between wiring lines using copper will be described as an example. However, in the present invention, a material of the wiring lines is not limited to copper alone, so that various materials that can be used for the wiring lines, such as aluminum, tungsten, molybdenum, ruthenium, nickel silicide, cobalt silicide, and the like can be used.

First, a contact layer 10 that is connected to an under-wiringline-layer (not illustrated) is formed. In more detail, a contact 21 using tungsten or copper as a conductive material is formed in an insulating layer 20 made, for example, of silicon oxide film. A diffusion prevention layer 11 made of silicon nitride carbide (SiCN), silicon nitride (SiN), boron nitride (BN), or the like and a titanium nitride (TiN) layer (first insulating layer) 12 are successively formed thereon, and a laminate structure 30 for forming a pattern such as photolithography or EUV (Extreme Ultra Violet) is deposited thereon. Here, the diffusion prevention layer 11 has a function as an etching stopper in etching the titanium nitride layer 12 and further has a function as a film for preventing expansion and diffusion of the wiring line by being integrated with a diffusion prevention film formed in a later step to cover the wiring line uniformly. Also, this laminate structure 30 can be made of an underlayer film 31 and a resist film 32, where a CVD (chemical vapor deposition) film containing carbon or an organic film formed by application can be used as the underlayer film 31, for example. Also, an organic film containing silicon (not illustrated) may be formed between the underlayer film 31 and the resist film 32.

Further, as shown in FIG. 1A, the resist film 32 is patterned.

Figure 1B:
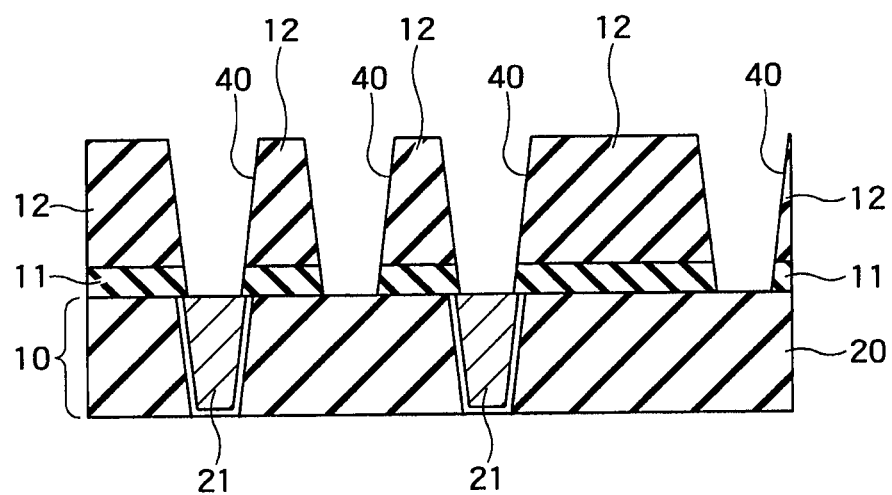

Referring to FIG. 1B, in accordance with the patterned resist film 32, the underlayer film 31, the titanium nitride layer 12, and the diffusion prevention layer 11 are patterned by using RIE (Reactive Ion Etching) or the like, thereby to form a groove 40. In the case of etching the titanium nitride layer 12 by RIE, it is preferable to use a gas containing $Cl_2$ and Al. In the case of etching the diffusion prevention layer 11 made of Si(C)N, it is preferable to use a gas containing fluorine, such as carbon fluoride ($CF_4$). Further, cleaning with a chemical liquid such as diluted hydrofluoric acid is preferably carried out in order to remove the underlayer film 31 and to remove the residues deposited on the side wall of the groove 40.

Next, a wiring line is formed by embedding a copper film 14 into the groove 40 formed by patterning the titanium nitride layer 12 and the diffusion prevention layer 11. As described before, the material of the wiring line is not limited to copper, so that aluminum, tungsten, molybdenum, ruthenium, nickel silicide, cobalt silicide, or the like can be used.

Figure 1C:
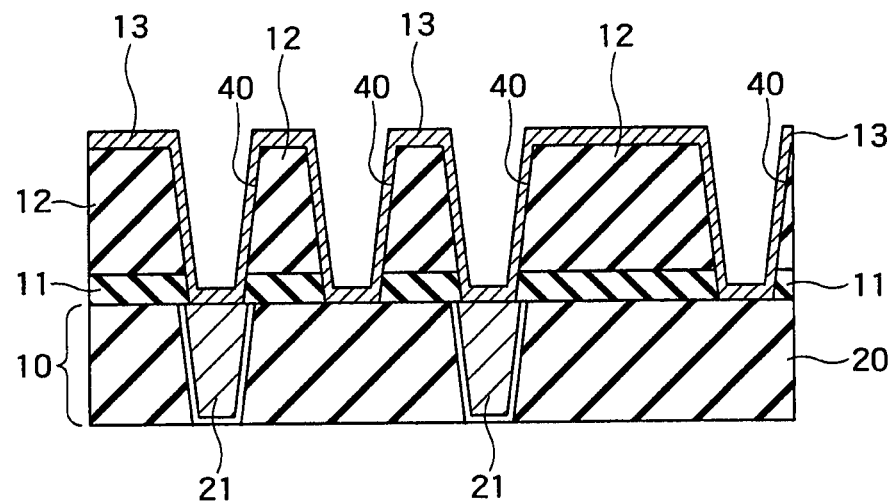

In more detail, as shown in FIG. 1C, a film of metal made, for example, of tantalum, manganese, ruthenium, nitride of these, or a combination of these is formed as a barrier metal 13 so as to cover the bottom surface and the side wall of the groove 40 disposed in the diffusion prevention layer 11 and the titanium nitride layer 12. At this time, the film is preferably formed by using a method such as PVD (Physical Vapor Deposition), CVD, ALD (Atomic Layer Deposition), or the like. Here, the barrier metal 13 at the part that covers the bottom surface and the lower portion of the side wall of the groove 40, more particularly, at the part that is in contact with the diffusion prevention layer 11 and at the part that is in contact with the insulating layer 20 of the contact layer 10, is preferably formed so that a film thickness of 2 nm or more can be ensured in order to prevent the moisture from these layers from being absorbed into the wiring line 15. Also, since the titanium nitride layer 12 does not contain moisture, there is no fear that the wiring line may absorb moisture from the titanium nitride layer 12 to deteriorate the wiring line, so that there is no need to prevent absorption of the moisture from the titanium nitride layer 12 into the wiring line by using the barrier metal 13. Therefore, the film thickness of the part of the barrier metal 13 that covers an upper portion of the side wall of the groove 40, in other words, the film thickness of the part of the barrier metal 13 that is located between the titanium nitride layer 12 and the wiring line, is not limited, so that, for example, the barrier metal 13 may be non-uniform, be discontinuous, or have a film thickness of 2 nm or less at this location.

Figure 1D:
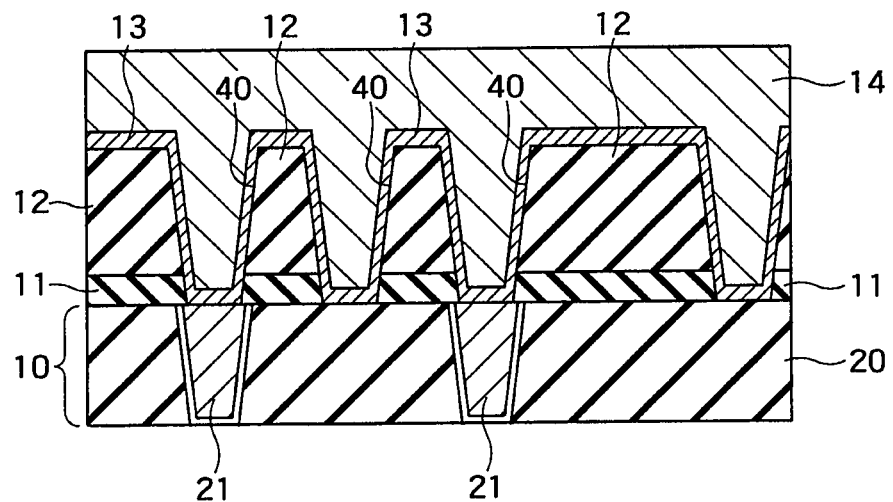

Subsequently, as shown in FIG. 1D, a copper film 14 is formed, for example, by PVD, CVD, ECD (Electro Chemical Deposition), or the like, and growth of grains is promoted by annealing to embed the copper film 14 into the groove 40 disposed in the diffusion prevention layer 11 and the titanium nitride layer 12. Here, the copper film 14 may be embedded without forming the barrier metal 13. When a copper film 14 containing manganese is formed in the groove 40 by PVD without forming the barrier metal 13, a material such as $MnSi_xO_y$ (0<X, y<1) is deposited on the surface of the wiring line by thermal history such as annealing that is carried out later. This material deposited on the surface can function as a protection film for protecting the wiring line at the time of removing the titanium nitride layer 12 that is subsequently carried out.

Figure 1E:
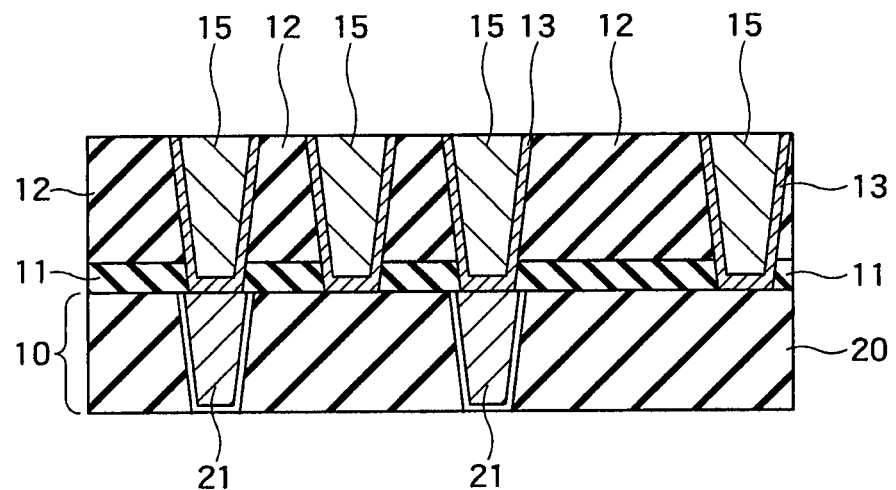

Thereafter, as shown in FIG. 1E, an excessive portion of the copper film 14 is removed by using CMP, so as to form the wiring line 15. At this time, by incorporating, for example, a controlling apparatus that measures an eddy current into the CMP processing apparatus, the interface between the copper film 14 and the titanium nitride layer 12 may be detected, whereby the controlling precision of CMP can be improved. Here, since the titanium nitride layer 12 and the copper film 14 have a high selectivity ratio of CMP, detection of the interface to the titanium nitride layer 12 is easy, so that there is no need to form the titanium nitride layer 12 to be thick in consideration of the scrape margin by CMP. Therefore, the aspect ratio of the groove 40 will be small, so that the embeddability of the copper film 14 will be improved. Further, since the selectivity of CMP is high, there will be no need of a process such as touch-up CMP, whereby the number of steps can be reduced.

Figure 1F:
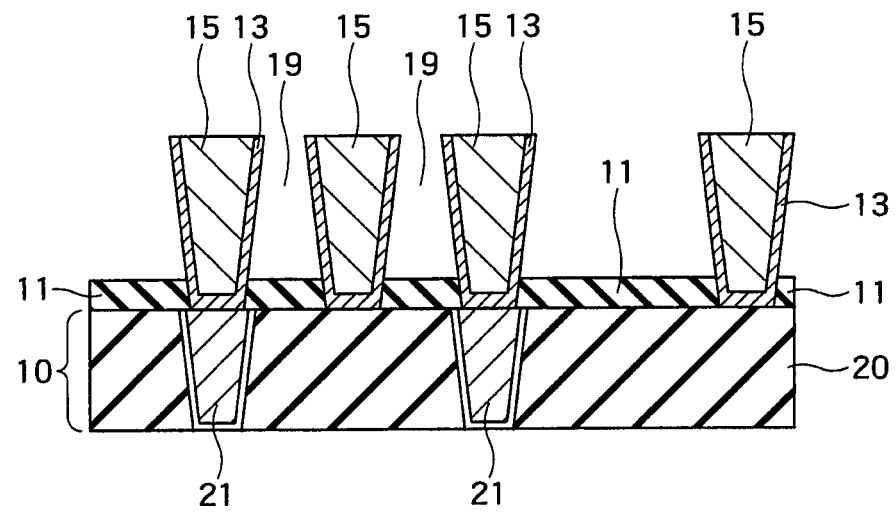

Subsequently, as shown in FIG. 1F, the titanium nitride layer 12 is removed by etching, so as to form an air gap 19 between adjacent wiring lines 15 to be in contact with the wiring lines 15. At this time, as a chemical liquid for etching the titanium nitride layer 12, a chemical liquid that does not dissolve the wiring lines 15 and the barrier metal 13 is preferably selected, so that the titanium nitride layer 12 is removed by oxidation using, for example, a chemical liquid mainly made of hydrogen peroxide water.

Figure 1G:
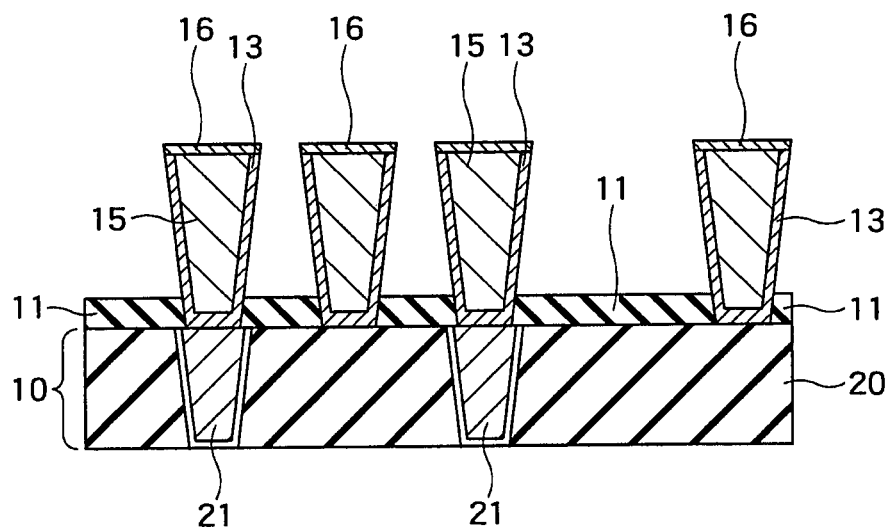

Next, as shown in FIG. 1G, a cap film 16 made of a metal that does not react with a diffusion prevention film made of Si(C)N or the like formed later, such as copper silicon nitride (CuSiN), cobalt tungsten phosphorus (CoWP), cobalt tungsten boron (CoWB), cobalt, or ruthenium is formed by CVD, ALD, nonelectrolytic plating, or the like on a top surface of the wiring line 15. This cap film 16 can enhance the close adhesion property between the wiring line 15 and the diffusion prevention film 17 formed later to cover the wiring line 15. Since this cap film 16 is made of a material that fits well to the copper constituting the wiring line 15, the material of the cap film 16 adheres to the site at which the surface of the wiring line 15 is exposed on the side wall of the wiring line 15 because of the discontinuity of the barrier metal 13, whereby the exposed site of the wiring line 15 can be covered.

In more detail, in the case of forming the cap film 16 made of CuSiN, the cap film 16 is formed, for example, by forming a silicon film after pre-processing the top surface of the wiring line 15 and then performing a plasma process on the silicon film by using ammonia ($NH_3$). In the case of forming the cap film 16 made of CoWP or CoWB, the cap film 16 is preferably formed by nonelectrolytic plating. Further, in the case of forming the cap film 16 made of cobalt, the cap film 16 is preferably formed by CVD. In the case of forming the cap film 16 made of ruthenium, the cap film 16 is preferably formed by CVD or ALD. Here, in the case of using nonelectrolytic plating, the cap film 16 may be formed by nonelectrolytic plating as shown in FIG. 1G after removal of the titanium nitride layer 12 shown in FIG. 1F as described before, or alternatively, by reversing the order, the removal of the titanium nitride layer 12 may be carried out after forming the cap film 16 by nonelectrolytic plating. In the latter case, the cap film 16 can function as a protection film for protecting the wiring line 15 at the time of removing the titanium nitride layer 12.

Here, when a barrier metal 13 containing manganese is formed, an insulating film containing manganese will be formed on the top surface of the wiring line 15 as the cap film 16 after the titanium nitride layer 12 shown in FIG. 1F is removed. Also, when the barrier metal 13 is dissolved at the time of removal of the titanium nitride layer 12 shown in FIG.

1F, an oxide film containing the metal constituting the barrier metal 13 will be formed on the top surface of the wiring line 15 as the cap film 16.

Figure 1H:
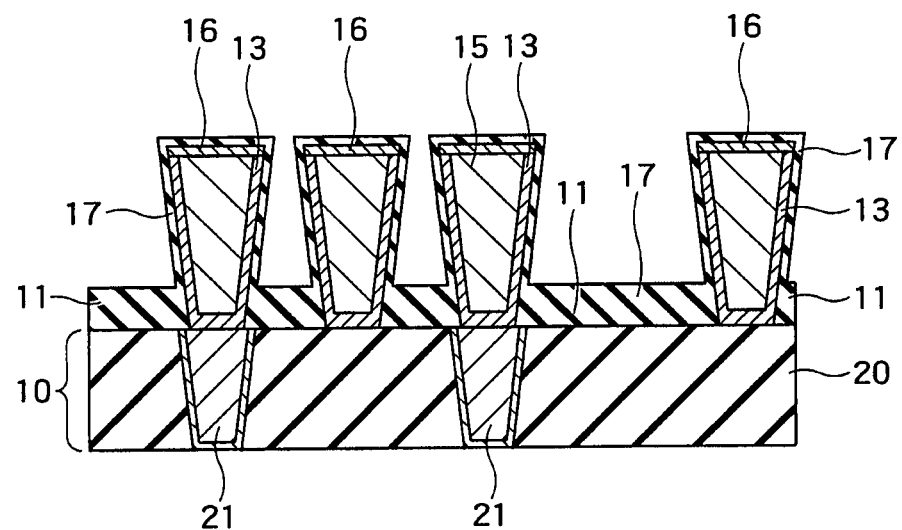
Figure 11:
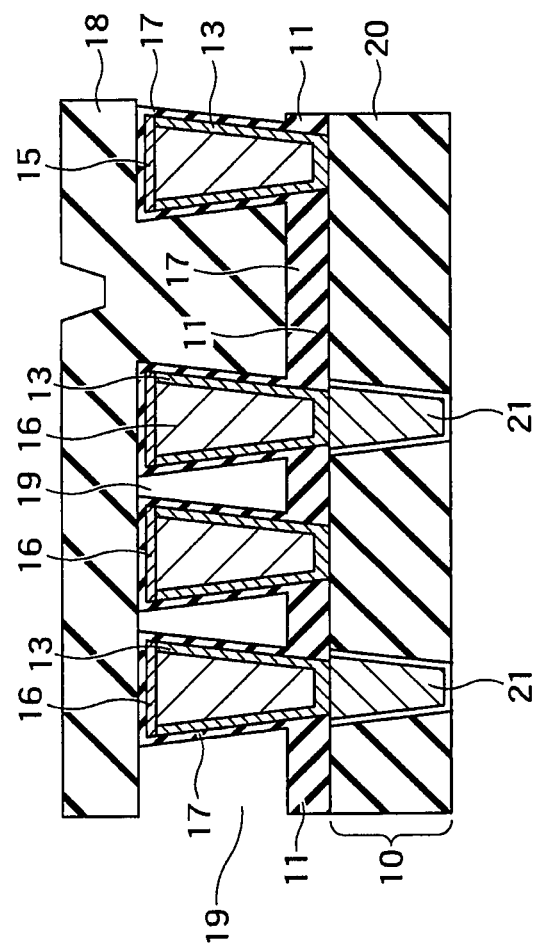

Next, as shown in FIG. 1H, a diffusion prevention film 17 having a compression stress and functioning for prevention of copper diffusion, such as Si(C)N or BN, is formed by CVD, ALD, or application so as to cover the top surface and the side wall of the wiring line 15 and to cover the top surface of the diffusion prevention layer 11 located between the wiring lines 15. This diffusion prevention film 17 will be a film integral with the diffusion prevention layer 11 so as to prevent diffusion of copper from the wiring line 15 while supporting the wiring line 15 and to have a function of restraining the thermal expansion of the wiring line 15 because of having a compression stress.

Further, as shown in FIG. 1I, a silicon oxide film is formed by CVD using, for example, a silane gas (p-SiH$_4$) as a principal material above the wiring line 15 so as to cover the top surface of the wiring line 15 and to let the air gap 19 remain at a desired position, thereby to form an insulating layer (second insulating layer) 18. Alternatively, an insulating layer 18 is formed by forming a silicon oxide film or a silicon oxycarbide film (SiCOH film) using a highly viscous application film.

Figure 2A:
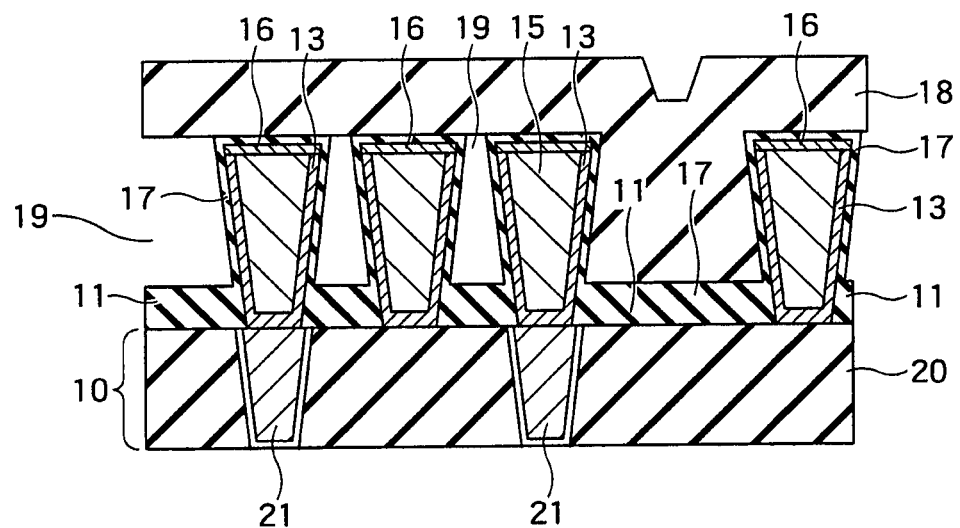
FIGS. 2A and 2B are cross-sectional views of the semiconductor device according to the first embodiment.

In this manner, a semiconductor device having a cross-section such as shown in FIG. 2A can be formed. This semiconductor device has an air gap 19 that is in contact with the wiring lines 15 at a desired position between the wiring lines 15.

Figure 2B:
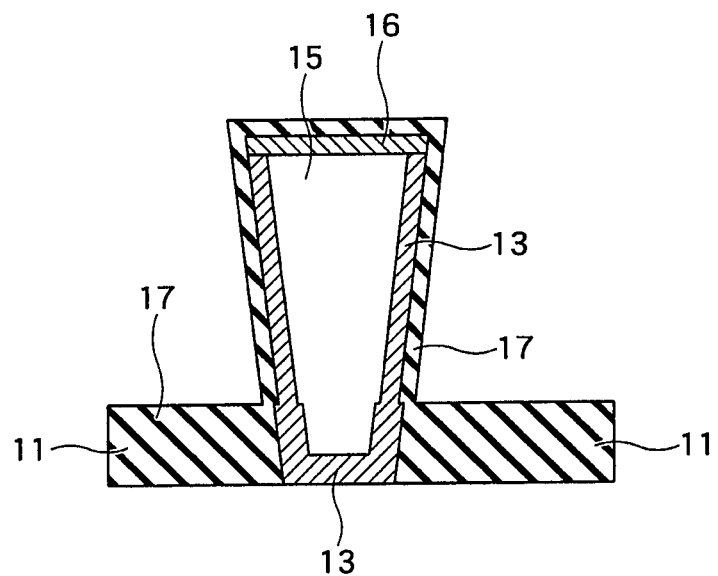

Further, as will be understood from an enlarged view of the cross-section of the wiring line 15 shown in FIG. 2B, the wiring line 15 is covered with the barrier metal 13. The barrier metal 13 that covers the wiring line 15, more particularly, at the surface that is in contact with the diffusion prevention film 11 and at the surface that is in contact with the insulating layer 20, preferably has a film thickness of 2 nm or more so as to prevent the moisture from these layers from being absorbed into the wiring line 15. With regard to the part that covers the side wall of the wiring line 15 other than that, the film thickness of the barrier metal 13 is not limited, as described before. Also, the cap film 16 made of CuSiN, CoWP, CoWB, cobalt, ruthenium, manganese oxide, or the like is present on the top surface of the wiring line 15, so as to enhance the close adhesion property between the wiring line 15 and the diffusion prevention film 17 formed to cover the wiring line 15. Further, the diffusion prevention film 17 made of Si(C)N, BN, or the like is formed so as to cover the top surface and the side wall of the wiring line 15 via the barrier metal 13 and the cap film 16. This diffusion prevention film 17 prevents diffusion of copper from the wiring line 15 while supporting the wiring line 15 and has a function of restraining the thermal expansion of the wiring line 15.

According to the present embodiment, even if the wiring line 15 is in contact with the air gap 19, diffusion of copper from the wiring line 15 and thermal expansion of the wiring line 15 can be restrained, and generation of defects such as electromigration and stress migration can be avoided, because the wiring line 15 is covered with the diffusion prevention film 17. In other words, a wiring line being stable even in a high temperature environment and having a high reliability can be formed.

Further, in the present embodiment, a layer made of titanium nitride is used as a sacrificial layer for forming the wiring line 15. Since the titanium nitride layer 12 does not contain moisture, there is no fear that the wiring line 15 may absorb moisture from the titanium nitride layer 12 to deteriorate the wiring line 15. Also, since the titanium nitride layer 12 and the material of the wiring line 15 have a high selectivity ratio of CMP, detection of the interface to the titanium nitride layer 12 is easy, so that there is no need to form the titanium nitride layer 12 to be thick in consideration of the scrape margin by CMP. Therefore, the aspect ratio of the groove 40 for embedding the wiring line 15 formed in the titanium nitride layer 12 will be small, so that the embeddability will be improved. Further, since the selectivity of CMP is high, there will be no need of a process such as touch-up CMP, whereby the number of steps can be reduced.

Also, according to the present embodiment, since a material that will be vaporized is not used as the sacrificial film, rise in the costs for production of the semiconductor device can be avoided.

(Second Embodiment)

Figure 3A:
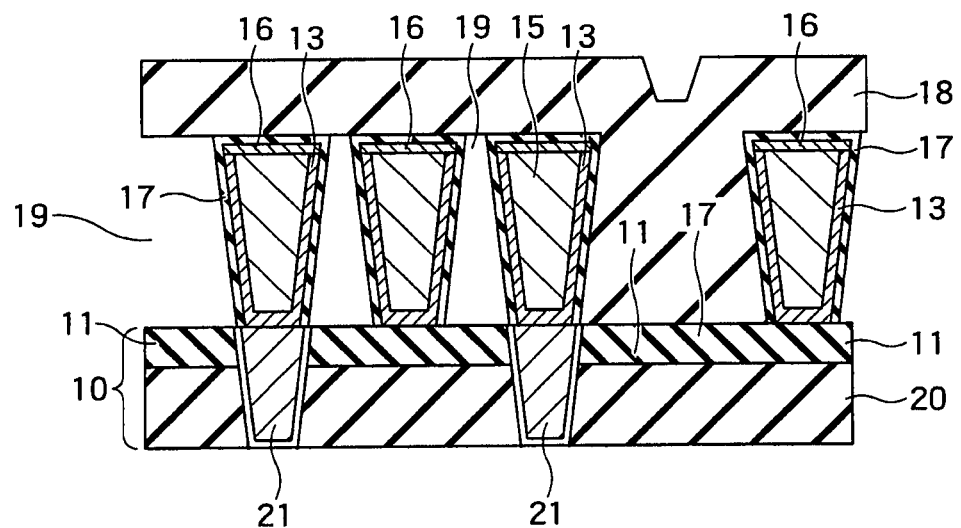
FIGS. 3A and 3B are cross-sectional views of a semiconductor device according to the second embodiment.

In the first embodiment, the diffusion prevention layer 11 is formed on the contact layer 10. In the present embodiment, the contact layer 10 is formed of the insulating layer 20 and the diffusion prevention layer 11, and the contact 21 is formed to penetrate through the insulating layer 20 and the diffusion prevention layer 11. By doing so, the air gap 19 can be disposed without having the diffusion prevention layer 11 between adjacent wiring lines 15, so that the capacitance between the wiring lines 15 can be controlled to have a desired value. A cross-sectional view of a semiconductor device according to the present embodiment is shown in FIG. 3A.

Figure 3B:
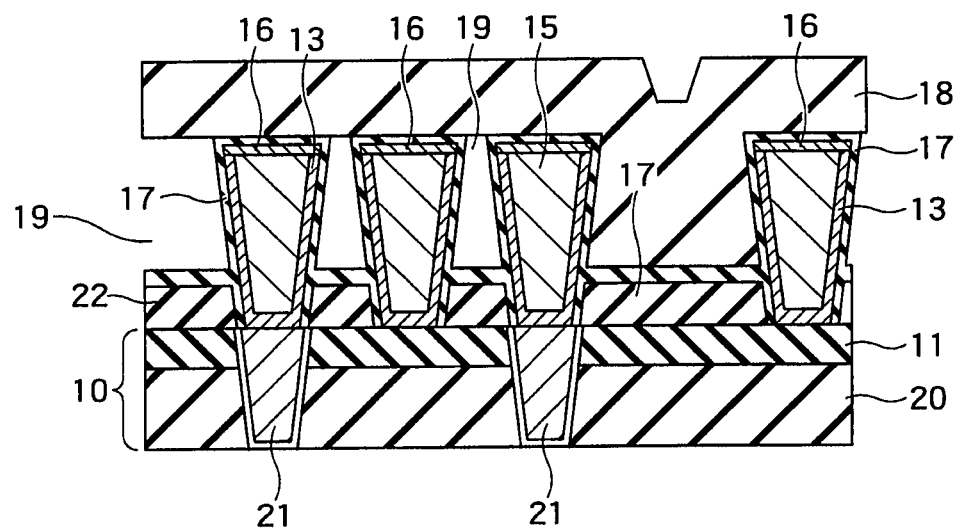

Also, as a modification of the present embodiment, the diffusion film 17 may be formed after an insulating layer 22 made of silicon oxide film or a SiCOH film is formed on the diffusion prevention layer 11. By doing so, a semiconductor device such as shown in the cross-sectional view of FIG. 3B can be obtained. In this manner, by controlling the quantities of the insulating layer 22, the diffusion prevention film 17, and the air gap 19 that are present between adjacent wiring lines 15, the capacitance between the wiring lines 15 can be controlled to have a desired value.

Here, in the present embodiment and in the modification of the present embodiment, in the same manner as in the first embodiment, the part that covers the bottom surface and the lower portion of the side wall of the groove 40, more particularly, at the part that is in contact with the insulating layer 22, at the part that is in contact with the diffusion prevention layer 11, and at the part that is in contact with the insulating layer 20 of the contact layer 10, is preferably formed so that a film thickness of 2 nm or more can be ensured in order to prevent the moisture from these layers from being absorbed into the wiring line 15.

According to the present embodiment, since the wiring line 15 is covered with the diffusion prevention film 17 in the same manner as in the first embodiment, diffusion of copper from the wiring line 15 and thermal expansion of the wiring line 15 can be restrained. Further, since a layer made of titanium nitride is used as a sacrificial layer for forming the wiring line 15, there is no fear that the wiring line 15 may absorb moisture from the titanium nitride layer 12 to deteriorate the wiring line 15. In addition, since the titanium nitride layer 12 and the material of the wiring line 15 have a high selectivity ratio of CMP, there is no need to form the titanium nitride layer 12 to be thick in consideration of the scrape margin by CMP. Further, according to the present embodiment, by controlling the quantity of each layer located between adjacent wiring lines 15, the capacitance between the wiring lines 15 can be controlled to have a desired value.

(Third Embodiment)

The present embodiment is different from the first embodiment in that an oxide film 23 made of silicon oxide film or SiCOH film is formed on the diffusion prevention layer 11, and the titanium nitride layer 12 is formed thereon. By doing so, since the oxide film 23 is easily dissolved into a chemical liquid, the titanium nitride layer 12 formed thereon can be removed with more certainty, that is, can be lifted off with more certainty. Therefore, since the titanium nitride layer 12 does not remain between the wiring lines 15, the capacitance between the wiring lines 15 can be made to have a desired value.

A method of producing a semiconductor device according to the present embodiment will be described with reference to FIGS. 4A to 4F. Here, description of the parts common to those in the first embodiment will be omitted.

Figure 4A:
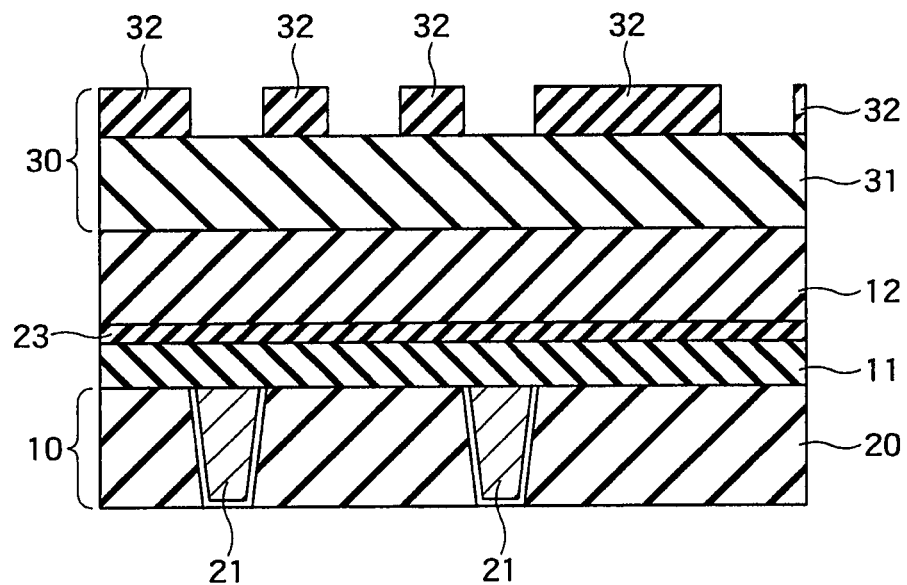
FIGS. 4A to 4F are cross-sectional views for describing steps for producing a semiconductor device according to the third embodiment.

First, in the same manner as in the first embodiment, a contact layer 10 that is connected to an under-wiringline-layer (not illustrated) is formed, and a diffusion prevention layer 11 is formed thereon. Further, an oxide film 23 made of silicon oxide film or SiCOH film is formed thereon, and a titanium nitride layer 12 is successively formed. Further, a laminate structure 30 made of an underlayer film 31 and a resist film 32 is deposited on the titanium nitride layer 12, and the resist film 32 is patterned as shown in FIG. 4A.

Figure 4B:
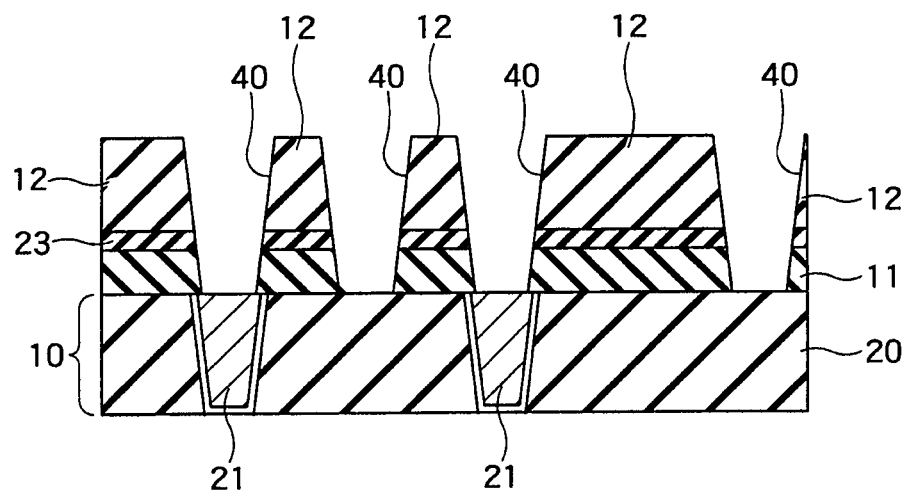

As shown in FIG. 4B, in the same manner as in the first embodiment, the underlayer film 31, the oxide film 23, the titanium nitride layer 12, and the diffusion prevention layer 11 are patterned in accordance with the patterned resist film 32, so as to form a groove 40. Further, the underlayer film 31 is removed.

Figure 4C:
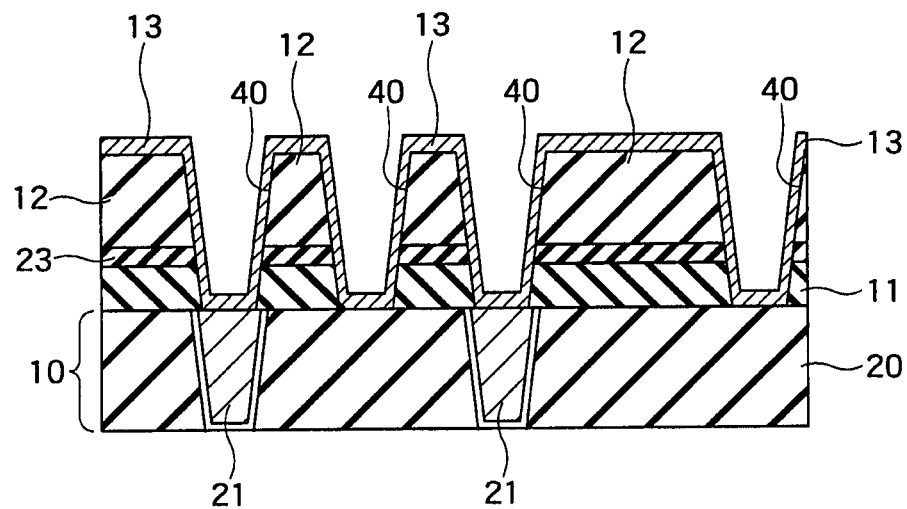

As shown in FIG. 4C, in the same manner as in the first embodiment, a barrier metal 13 is formed so as to cover the bottom surface and the side wall of the groove 40. Here, the barrier metal 13 at the part that covers the bottom surface and the lower portion of the side wall of the groove 40, more particularly, at the part that is in contact with the oxide film 23, at the part that is in contact with the diffusion prevention layer 11, and at the part that is in contact with the insulating layer 20 of the contact layer 10, is preferably formed so that a film thickness of 2 nm or more can be ensured in order to prevent the moisture from these layers from being absorbed into the wiring line 15. Also, since the titanium nitride layer 12 does not contain moisture, there is no fear that the wiring line may absorb moisture from the titanium nitride layer 12 to deteriorate the wiring line, so that there is no need to prevent absorption of the moisture from the titanium nitride layer 12 into the wiring line by using the barrier metal 13. Therefore, the film thickness of the part of the barrier metal 13 that is located between the titanium nitride layer 12 and the wiring line 15 is not limited, so that, for example, the barrier metal 13 may be non-uniform, be discontinuous, or have a film thickness of 2 nm or less at this location.

Figure 4D:
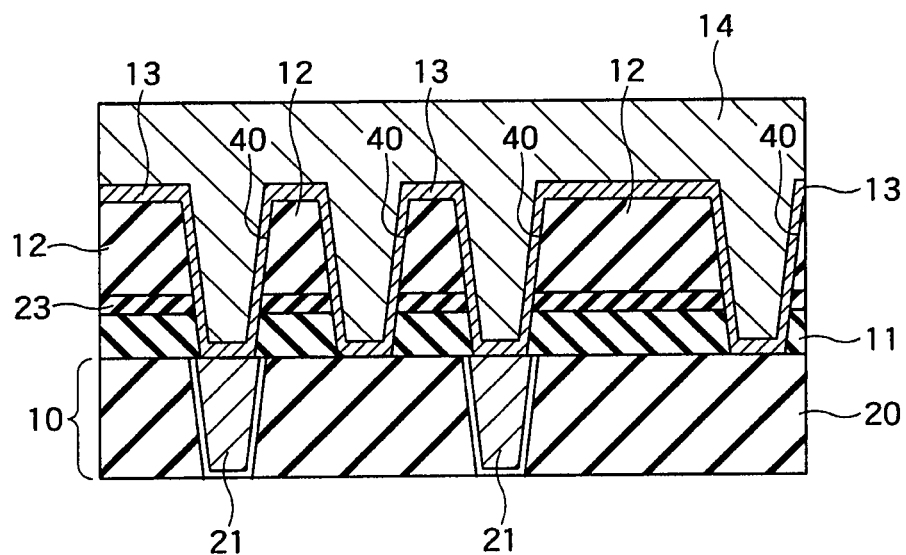
Figure 4E:
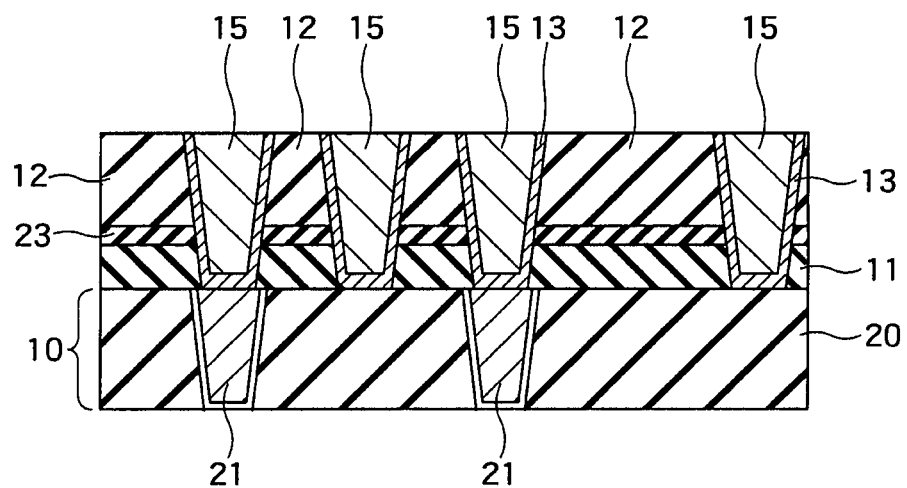

Next, as shown in FIG. 4D, in the same manner as in the first embodiment, a copper film 14 is embedded via the barrier metal 13 into the groove 40 formed by patterning the insulating film 23, the titanium nitride layer 12, and the diffusion prevention layer 11. As described before, the material of the wiring line 15 is not limited to copper, so that aluminum, tungsten, molybdenum, ruthenium, nickel silicide, cobalt silicide, or the like can be used.

Figure 4F:
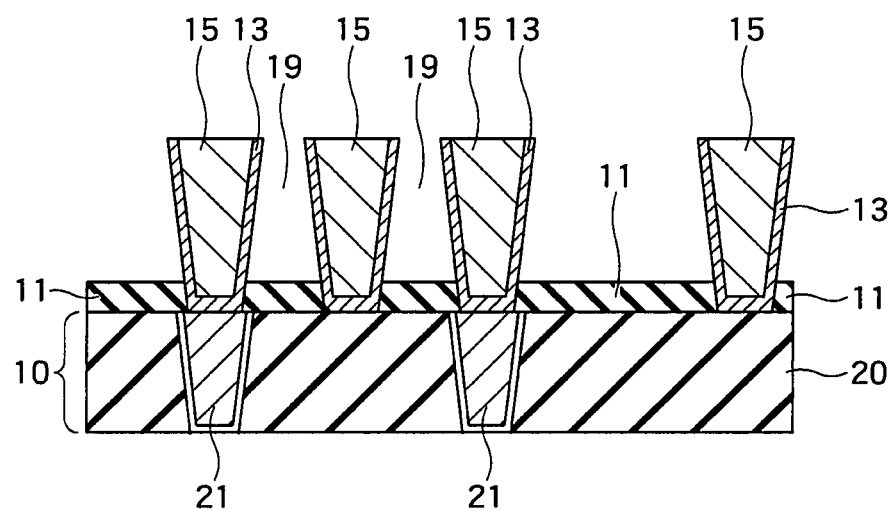

Thereafter, as shown in FIG. 4F, in the same manner as in the first embodiment, an excessive portion of the copper film 14 is removed by using CMP, so as to form the wiring line 15. Here, since the titanium nitride layer 12 and the copper film 14 have a high selectivity ratio of CMP, detection of the interface to the titanium nitride layer 12 is easy, so that there is no need to form the titanium nitride layer 12 to be thick in consideration of the scrape margin by CMP. Therefore, the aspect ratio of the groove 40 for embedding the copper film 14 will be small, so that the embeddability of the copper film 14 will be improved. Further, since the selectivity of CMP is high, there will be no need of a process such as touch-up CMP, whereby the number of steps can be reduced.

Subsequently, as shown in FIG. 4F, in the same manner as in the first embodiment, the titanium nitride layer 12 is removed. Even if the titanium nitride layer 12 remains, by adding a process using a hydrofluoric-acid-based chemical liquid (DHF), the liquid reaches and dissolves the oxide film 23, so that the titanium nitride layer 12 formed thereon can be lifted off with more certainty. The subsequent steps are similar to those of the first embodiment, so that the description thereof will be omitted here (See FIGS. 1G to 1I).

According to the present embodiment, since the wiring line 15 is covered with the diffusion prevention film 17 in the same manner as in the first embodiment, diffusion of copper from the wiring line 15 and thermal expansion of the wiring line 15 can be restrained. Further, since a layer made of titanium nitride is used as a sacrificial layer for forming the wiring line 15, there is no fear that the wiring line 15 may absorb moisture from the titanium nitride layer 12 to deteriorate the wiring line 15. In addition, since the titanium nitride layer 12 and the material of the wiring line 15 have a high selectivity ratio of CMP, there is no need to form the titanium nitride layer 12 to be thick in consideration of the scrape margin by CMP. Further, according to the present embodiment, the titanium nitride layer 12 can be removed with more certainty, so that the capacitance between adjacent wiring lines 15 can be made to have a desired value.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a semiconductor substrate;
    a contact layer formed above the semiconductor substrate;
    wiring lines formed above the contact layer, top surfaces and side walls of the wiring lines being covered with a diffusion prevention film, a top surface of the contact layer located between the adjacent wiring lines being covered with the diffusion prevention film;
    a first insulating layer formed above the top surface of the wiring lines; and
    an air gap formed by the side walls of the adjacent wiring lines, the contact layer and the first insulating layer, the air gap being in contact with the wiring lines via the diffusion prevention film.

2. The semiconductor device of claim 1, wherein the diffusion prevention film includes a silicon nitride carbide film, a silicon nitride film, or a boron nitride film.

3. The semiconductor device of claim 1, further comprising a cap film between the top surfaces of the wiring lines and the diffusion prevention film.

4. The semiconductor device of claim 3, wherein the cap film contains at least one of copper silicon nitride, cobalt tungsten phosphorus, cobalt tungsten boron, cobalt, ruthenium, and manganese oxide.

5. The semiconductor device of claim 1, further comprising a barrier metal on bottom surfaces of the wiring lines and between the side walls of the wiring lines and the diffusion prevention film, wherein, a first part of the barrier metal covers the bottom surfaces of the wiring lines and lower portions of the side walls, a second part of the barrier metal covers upper portions of the side walls of the wiring lines, and the first part has a larger thickness than the second part.

6. The semiconductor device of claim 5, wherein the barrier metal contains at least one of tantalum, manganese, and ruthenium.

7. The semiconductor device of claim 1, further comprising a second insulating layer above a top surface of the contact layer located between the adjacent wiring lines.

8. The semiconductor device of claim 1, wherein the semiconductor substrate comprises a contact.

9. The semiconductor device of claim 1, wherein the cross sections of the wiring lines have the shape of a trapezoid with a lower base shorter than an upper base.

10. The semiconductor device of claim 5, wherein the lower portions of the side walls are in contact with the diffusion prevention film, and the first part of the barrier metal has a film thickness of 2 nm or more.

* * * * *